(12) United States Patent
Lin et al.

(10) Patent No.: US 9,417,425 B2
(45) Date of Patent: Aug. 16, 2016

(54) MICRO-ELECTROMECHANICAL SYSTEM (MEMS) CARRIER

(71) Applicant: GlobalMEMS TAIWAN CORPORATION LIMITED, Chu-Pei (TW)

(72) Inventors: Su-Jhen Lin, Hsinchu County (TW); Ming-Ching Wu, Chu-Pei (TW)

(73) Assignee: GLOBALMEMS TAIWAN CORPORATION LIMITED, Chu-Pei (TW)

( * ) Notice: Subject to any disclaimer, the term of this patent is extended or adjusted under 35 U.S.C. 154(b) by 30 days.

(21) Appl. No.: 14/341,344

(22) Filed: Jul. 25, 2014

(65) Prior Publication Data
US 2015/0029606 A1     Jan. 29, 2015

(30) Foreign Application Priority Data

Jul. 26, 2013   (TW) .............................. 102126909 A

(51) Int. Cl.
*G02B 7/02*     (2006.01)
*H02K 41/02*     (2006.01)
(Continued)

(52) U.S. Cl.
CPC ... *G02B 7/08* (2013.01); *B81B 3/00* (2013.01); *G02B 7/182* (2013.01); *G02B 26/085* (2013.01); *G02B 26/0833* (2013.01); *H02K 33/18* (2013.01); *B81B 3/0018* (2013.01); *B81B 2201/02* (2013.01); *B81B 2201/04* (2013.01); *B81B 2201/042* (2013.01); *G02B 7/18* (2013.01); *G02B 26/101* (2013.01); *H02K 35/00* (2013.01); *H02K 41/02* (2013.01)

(58) Field of Classification Search
CPC ............ G02B 7/08; G02B 7/18; G02B 7/182; G02B 26/0816; G02B 26/0833; G02B 26/0841; G02B 26/085; G02B 26/101; B81B 3/00; B81B 3/0018; B81B 3/0027; B81B 3/0035; B81B 3/0051; B81B 2201/02; B81B 2201/04; B81B 2201/042; B81B 3/0062; B81B 2203/058; H02K 33/18; H02K 35/00; H02K 41/02; G01C 19/5719
USPC .............. 359/811, 813, 814, 823, 824, 214.1, 359/223.1, 224.1; 73/504.02, 504.09, 73/504.12, 514.17; 335/222
See application file for complete search history.

(56) References Cited

U.S. PATENT DOCUMENTS 4,421,381 A * 12/1983 Ueda ................... G02B 26/0816
                                                          310/36
5,331,852 A * 7/1994 Greiff ................ G01C 19/5719
                                                         73/504.09

(Continued)

*Primary Examiner* — Loha Ben
(74) *Attorney, Agent, or Firm* — Muncy, Geissler, Olds & Lowe, P.C.

(57) ABSTRACT

A micro-electromechanical system (MEMS) carrier formed by a typical surface micro-machining and bulk micro-machining process on a silicon substrate, having a frame, a movable carrier element, a conductive coil, two return springs and a pair of permanent magnets. The movable carrier element is formed within the frame and movable along a path, the conductive coil is formed on or embedded in the movable carrier element. The two return springs are formed between the movable carrier element and the frame thereby connecting the movable carrier element to the frame and providing a return force to the carrier element, and the pair of permanent magnets are formed a magnetic field for co-acting with the conductive coil for generating an electromagnetic Lorentz force to drive the movable carrier element to move against the return force of the two return springs.

13 Claims, 9 Drawing Sheets

(51) Int. Cl.
  *G02B 7/08* (2006.01)
  *G02B 7/182* (2006.01)
  *G02B 26/08* (2006.01)
  *H02K 33/18* (2006.01)
  *G02B 7/18* (2006.01)
  *G02B 26/10* (2006.01)
  *B81B 3/00* (2006.01)
  *H02K 35/00* (2006.01)

(56) References Cited

U.S. PATENT DOCUMENTS 5,488,862 A * 2/1996 Neukermans ...... G01C 19/5719
 73/504.02
5,912,608 A * 6/1999 Asada .................... H02K 33/18
 310/36
6,044,705 A * 4/2000 Neukermans ...... G01C 19/5719
 359/196.1

* cited by examiner

MICRO-ELECTROMECHANICAL SYSTEM (MEMS) CARRIER

BACKGROUND OF THE INVENTION

1. Field of the Invention

The present invention relates to a micro-electromechanical system carrier, especially to a micro-electromechanical system carrier having a movable carrier element movable by an electromagnetic Lorentz force F.

2. Description of the Related Art

Nowadays, most of 3-C products, like cell-phone, notebook or tablet PC, are normally being equipped with a micro-digital camera lens.

For getting more product attractions to consumers, the camera lens with auto-focusing or optical-variable function has become an important requirement. However, all the camera lens with auto-focusing needs lens needs nearly 10 micrometer space to move, it is quite difficult to install a step motor and gear system in a 3-C product, such as cell-phone, tablet PC as well as note-book.

In this regard, for minimizing the driving mechanism for lens focusing, traditional voice coil motor (VCM) structure may be a good solution. The voice coil motor can generate a magnetic force to co-act with an outside magnetic element to move a lens.

Although, some existing commercialized auto-focusing lens module with micro-electromechanical system being adopted, the VCM structure, however such kinds of commercial available auto-focusing lens modules are quite complex and heavy, bulky in size, therefore it still need to take further efforts to microminiaturize and simplify it.

SUMMARY OF THE INVENTION

In order to microminiaturize the auto-focusing lens module instead of traditional VCM structure, the present invention provides a micro-electromechanical system carrier which may include at least a frame, a movable carrier element located within the frame movable along a path, a conductive coil formed on the movable carrier element, and two return springs for connecting the movable carrier element inside the frame. By this structure, the return springs provide a return force to the carrier element.

In one embodiment, the conductive coil may be embedded in or formed on the surface of the movable carrier element. The two permanent magnets with opposite magnetic field may be mounted near the moving path of the movable carrier element to provide two opposite magnetic field perpendicular to the movable carrier element.

In physics, when a particle of charge q moves with a velocity v in an electric field E and a magnetic field B, then the particle of charge q will experience a Lorentz force $F=q[E+(v \times B)]$. When a current is supplied to the conductive coil, the current shall flow in a counter-clockwise direction, and then the conductive coil will co-act with the permanent magnets and generate an electromagnetic Lorentz force. The electromagnetic Lorentz force shall drive the movable carrier element to move along a path in a direction against the force of the two return springs. When the current is stopped, the electromagnetic Lorentz force shall then be disappeared, and the two return springs provide a steady support and push the movable carrier element return to an original position.

In this embodiment, the distance and direction of the moving of the movable carrier element can be adjusted by changing the current flow in the conductive coil. By this way, the micro-electromechanical system carrier according to the present invention can use to carry a lens of a micro-camera module for focus-adjustment. The current flow may be conducted by a conductive layer of the frame and two return springs, and then form a circuit with the conductive coil.

In some other embodiment, a micro-electromechanical system carrier according to the present invention is capable of moving X- and Y-axis directions, which includes a first frame, a second frame, two first return springs, a movable carrier element, two second return springs, a first conductive coil, a second conductive coil.

In this embodiment, the second frame is formed within the first frame, and a first conductive coil is formed on the second frame. The two first return springs are connected between the first frame and the second frame and aligned with each other in the Y-axis direction. The movable carrier element is formed inside the second frame, and the second conductive coil is embedded in or formed on the surface of the movable carrier element. The two second return springs are connected between the movable carrier element and the second frame in X-axis direction, so as to provide a restoring force to the movable carrier element in X-axis direction. In this embodiment, the X-axis direction is perpendicular to the Y-axis direction, and the movable carrier element can move on a two dimensional plane by controlling the current flow in the first conductive coil and the second conductive coil.

As being described in the aforementioned embodiments, the first conductive coil may be embedded in or formed on either surface of the second frame. Similarly, the second conductive coil may also be embedded in or formed on the surface of the movable carrier element. In other embodiment, the first conductive coil is embedded in or formed on both surfaces of the second frame, and the second conductive coil is embedded in or formed on both surfaces of the movable carrier element. In another embodiment, the second conductive coil is formed around the movable carrier element.

In this embodiment, two magnetic fields are created in opposite directions by two pair of permanent magnets. When the current flows in the second conductive coil in clockwise direction, shall co-act with the magnetic field to generate an electromagnetic Lorentz force to move the movable carrier element in X-axis direction; and while the current being stopped, two second return springs shall provide sufficient support and move the movable carrier element back to its original position.

Due to the direction of the magnetic field being opposite to the magnetic field co-acting with the second conductive coil, while the current I has entered to flow in the first conductive coil in clockwise direction, the first conductive coil shall co-act with said magnetic field to generate an electromagnetic Lorentz force to move the second frame in Y-axis direction. As the movable carrier element is flexibly connected to the second frame, said electromagnetic Lorentz force would carry the second frame as well as the movable carrier element to move in Y-axis direction; and while the current being stopped, the two first return springs shall provide sufficient support and push the second frame to move back to the original position thereof in Y-axis direction.

By controlling the intensity and direction of the current in first conductive coil and second conductive coil, the movable carrier element may be precisely positioned in an X-Y plane. By this way, the micro-electromechanical system carrier according to the present invention can be incorporated in a two-axis autofocus miniature camera module.

The movable carrier element of this embodiment can be adopted to carry an image sensor, such as a CMOS image sensor, and moved in an X-Y plane so as to achieve an optical image stabilization function. By incorporating the micro-electromechanical system carrier of the present invention in an autofocus miniature camera module, the designer can improve the product with further minimized, noiseless, anti-vibration, and low power consumption.

The advantages of the present invention include a capability of driving the movable carrier element by controlling the intensity and direction of the current flow in the first conductive coil and second conductive coil, by this way to generate one or more electromagnetic Lorentz forces in one or more directions.

BRIEF DESCRIPTION OF THE DRAWINGS

The accompanying drawings, which are included to provide a further understanding of the invention, are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
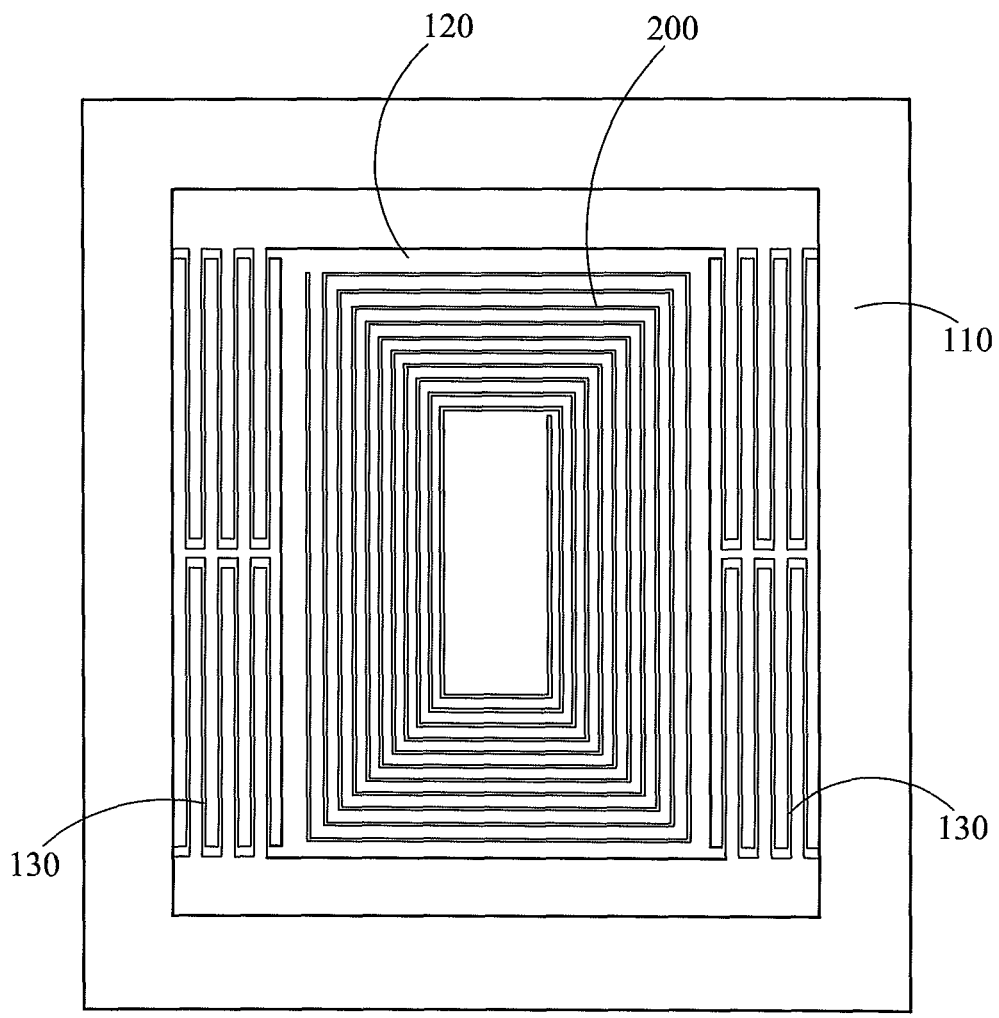
FIG. 1 is a schematic elevated view of an embodiment of micro-electromechanical system carrier according to the present invention.
Figure 2:
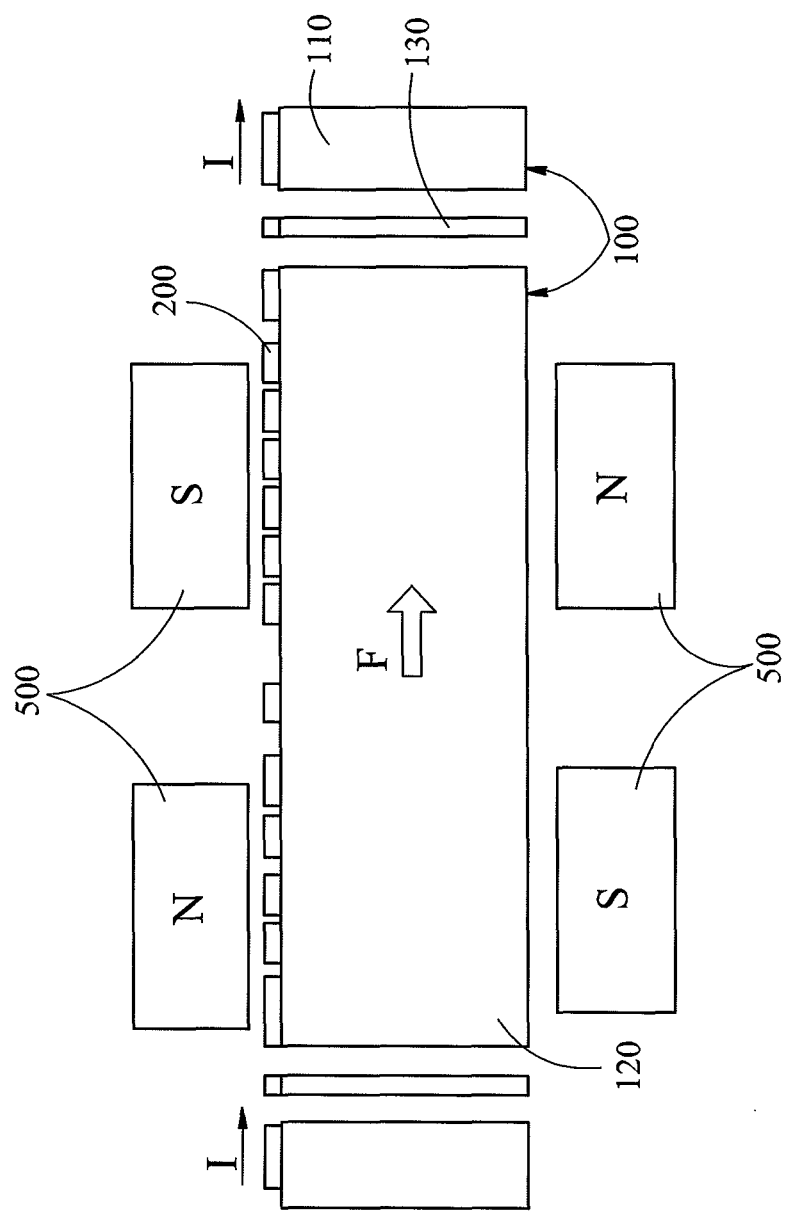
FIG. 2 is a schematic side view of the micro-electromechanical system carrier of FIG. 1.
Figure 3:
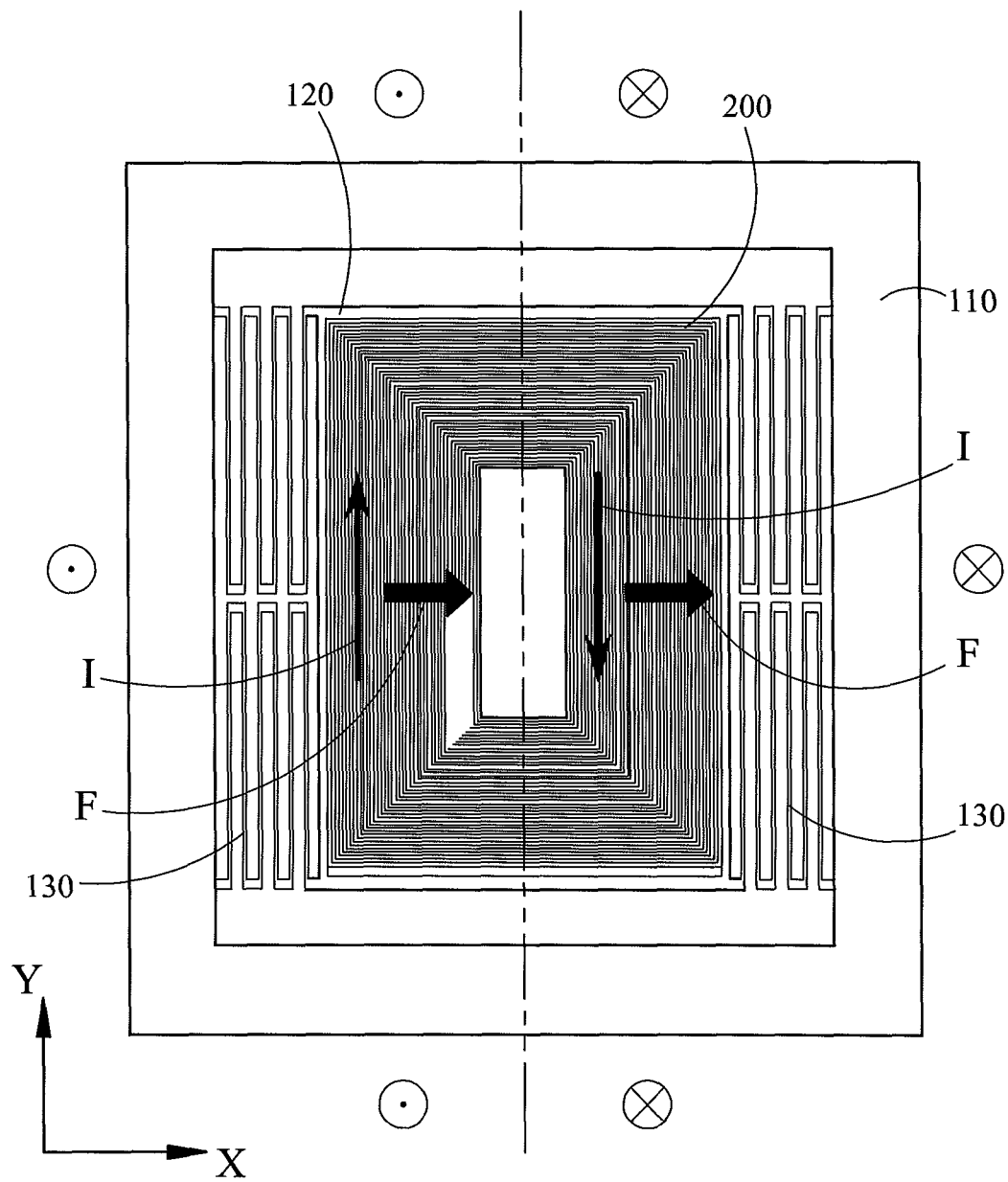
FIG. 3 is a schematic elevated view illustrating the operation of the micro-electromechanical system carrier of FIG. 1.

Referring to FIGS. 1 to 3, an embodiment of a micro-electromechanical system (MEMS) carrier according to the present invention is formed on a silicon substrate 100 by a micro-machining and bulk micro-machining process. The micro-electromechanical system carrier provides a frame 110, a movable carrier element 120 formed within the frame 110 and movable along a path within the frame 110, a conductive coil 200 formed on the movable carrier element 120, and the two return springs 130 being formed for connecting the movable carrier element 120 inside the frame 110. By this structure, the return springs 130 can provide a return force to the carrier element 120.

In one embodiment, the silicon substrate 100 may adopt a thicker Silicon On Insulator (SOI) substrate with low internal stress. The frame 110, the movable carrier element 120, the conductive coil 200 and the two return springs 130 being formed by a typical surface micro-machining and bulk micro-machining process on the silicon substrate 100. For instance, the aforementioned Surface Micro-machining may include a thin film deposition, micro-imaging technique, just like the process used to apply in semiconductor industry, so as to form a mechanical structure of thin film stacking.

After the Surface Micro-machining and Bulk Micro-machining process being finished, the silicon substrate 100 shall be removed from the micro-electromechanical system. By this step, the micro-structure of the micro-electromechanical system is then become a 3-dimensional structure and get more aspect ratio to form the frame 110, the movable carrier element 120, the two return springs 130 and the conductive coil 200.

Figure 4:
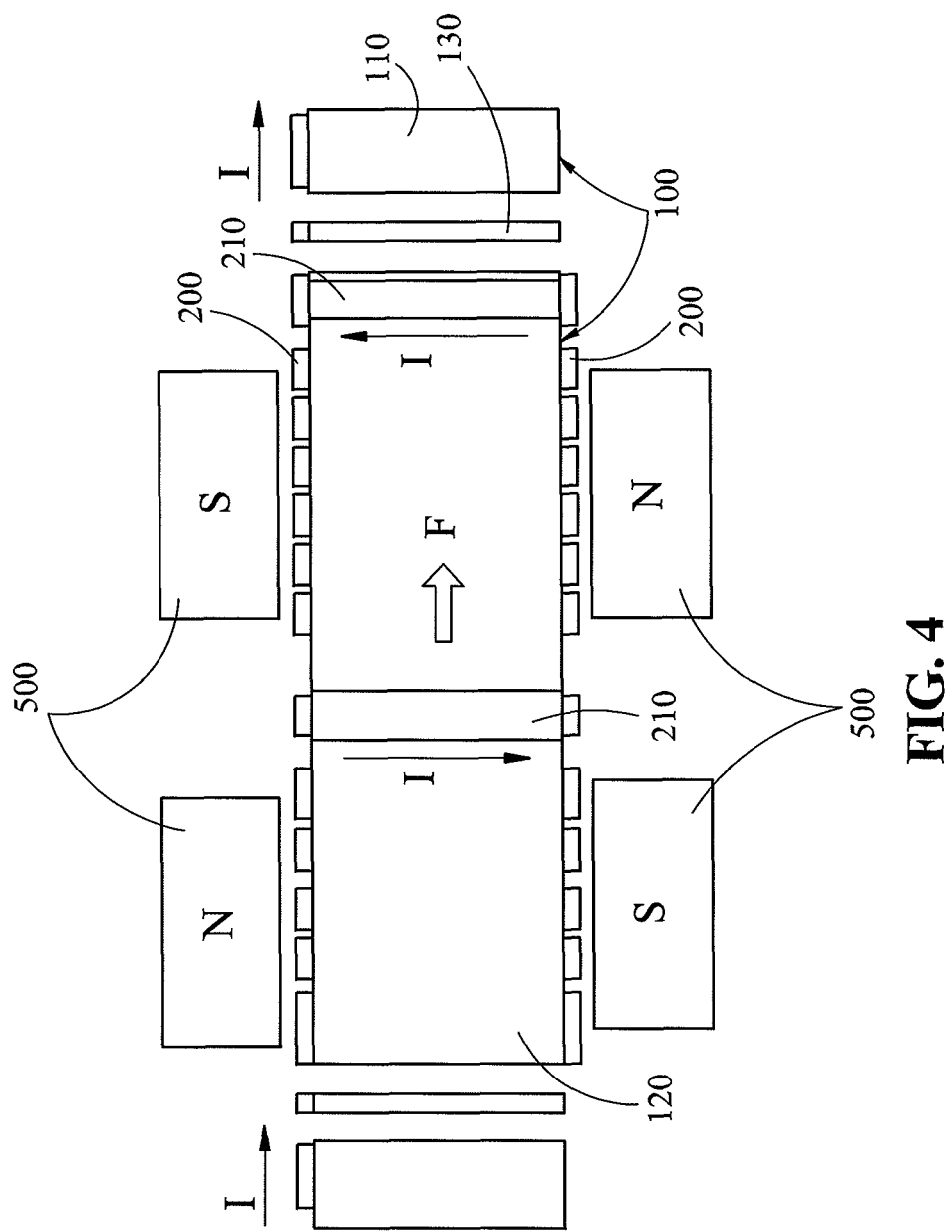
FIG. 4 is a schematic elevated view of a second embodiment of the micro-electromechanical system carrier according to the present invention.
Figure 5:
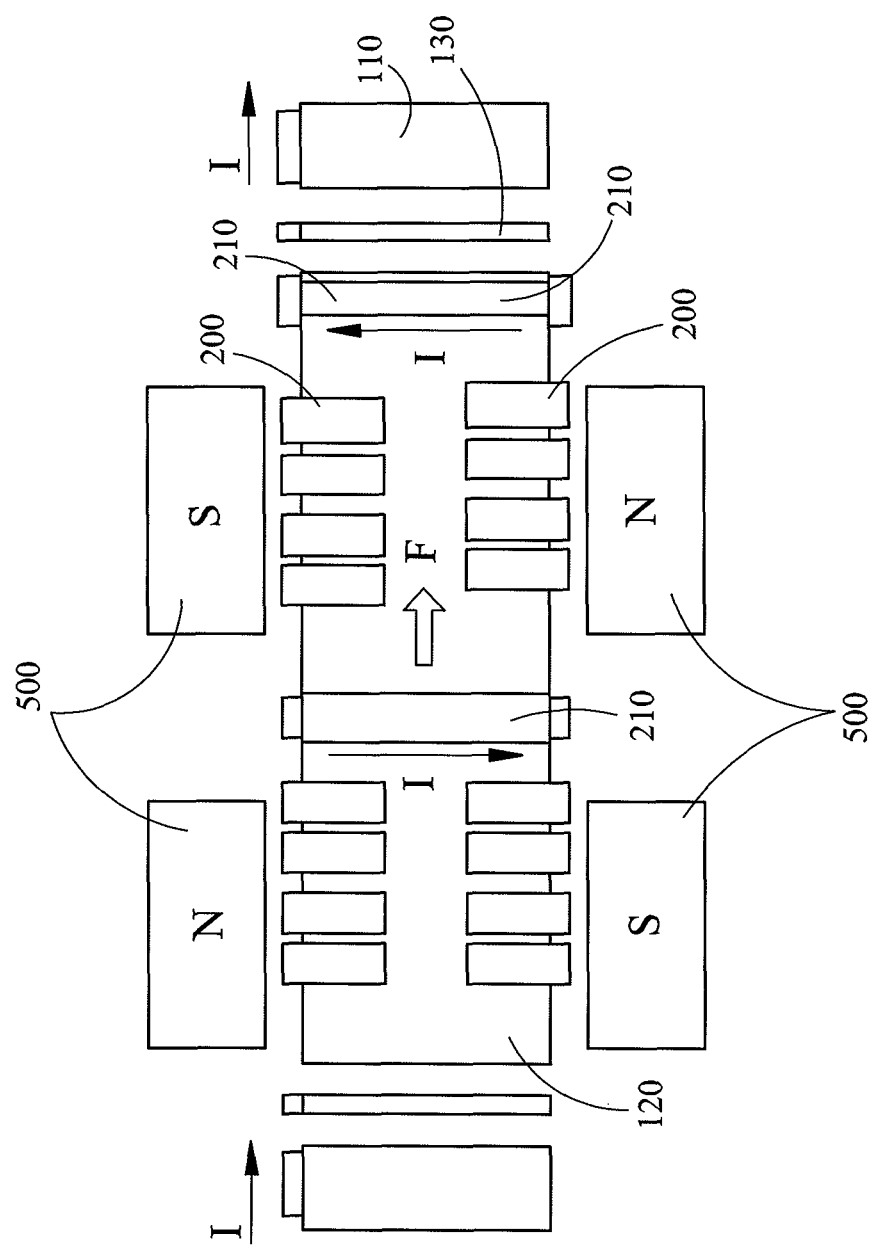
FIG. 5 is a schematic side view of the micro-electromechanical system carrier of FIG. 4.

In one embodiment, the conductive coil 200 may be embedded in or formed on the surface of the movable carrier element 120 as best shown in FIGS. 4 and 5. Two permanent magnets 500 with opposite magnetic field may be mounted near the moving path of the movable carrier element 120 that provide two opposite magnetic field (indicated as ⊙ and ⊕) perpendicular to the movable carrier element 120.

As shown in FIG. 3, when a current I has been supplied to the conductive coil 200, the current I shall flow in a counter-clockwise direction, and then co-act with the permanent magnets 500 that will generate an electromagnetic Lorentz force F. The electromagnetic Lorentz force F shall drive the movable carrier element 120 to move along a path in a direction against the force of the two return springs 130. When the current I is distinguished, the electromagnetic Lorentz force F shall then be disappeared, and the two return springs 130 provide a steady support and push the movable carrier element 120 to return to an original position.

In this embodiment, the distance and direction of the moving of the movable carrier element 120 can be adjusted by changing the flow of the current I in the conductive coil 200. By this way, the micro-electromechanical system (MEMS) carrier according to the present invention can use to carry a lens of a micro-camera module for focus-adjustment. The current flow may conduct by a conductive layer of the frame 110 and two return springs 130, and then formed a circuit with the conductive coil 200.

Referring to FIG. 3, the conductive coil 200 may be embedded in or formed on either surface of the movable carrier element 120. Referring to FIGS. 4 and 5, the conductive coil 200 may be embedded in or formed on both surfaces of the movable carrier element 120, and provides a connecting portion 210 for providing an electrical connection therebetween. When the current I is supplied to the conductive coil 200, the conductive coil will co-act with the permanent magnets 500 to generate an electromagnetic Lorentz force F thereby driving the movable carrier element 120 to move in a distance against the force of the two return springs 130.

Figure 6:
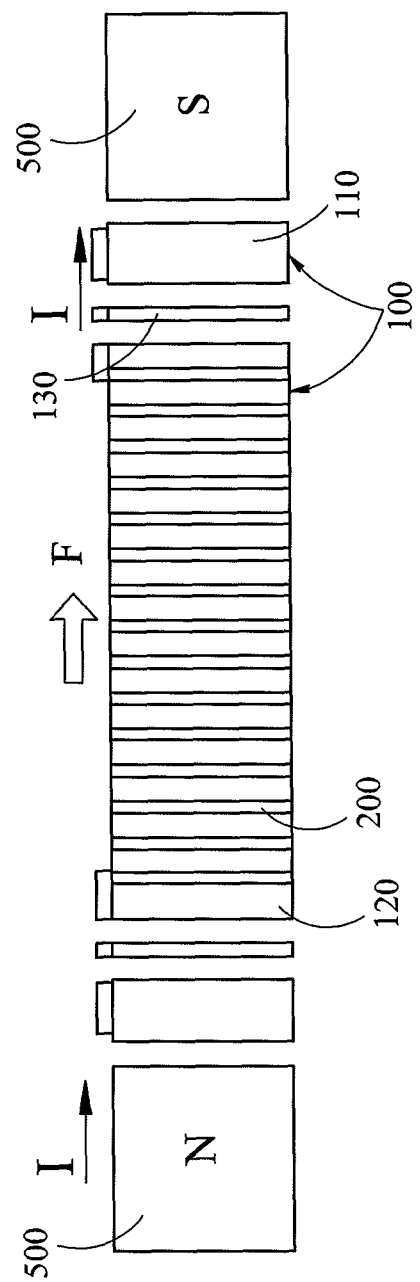
FIG. 6 is a schematic side view of a third embodiment of the micro-electromechanical system carrier according to the present invention.

Referring to FIG. 6, the conductive coil 200 can also be formed around the movable carrier element 120, and the permanent magnets 500 are disposed aligned with the moving path of the movable carrier element 120. When the current I is supplied to the conductive coil 200, will co-acting with the permanent magnets 500 to generate an electromagnetic Lorentz force F thereby driving the movable carrier element 120 to move in a distance against the force of the two return springs 130, and the two return springs 130 provide a steady support and push the movable carrier element 120 to return to an original position after the current I being stopped.

Figure 7:
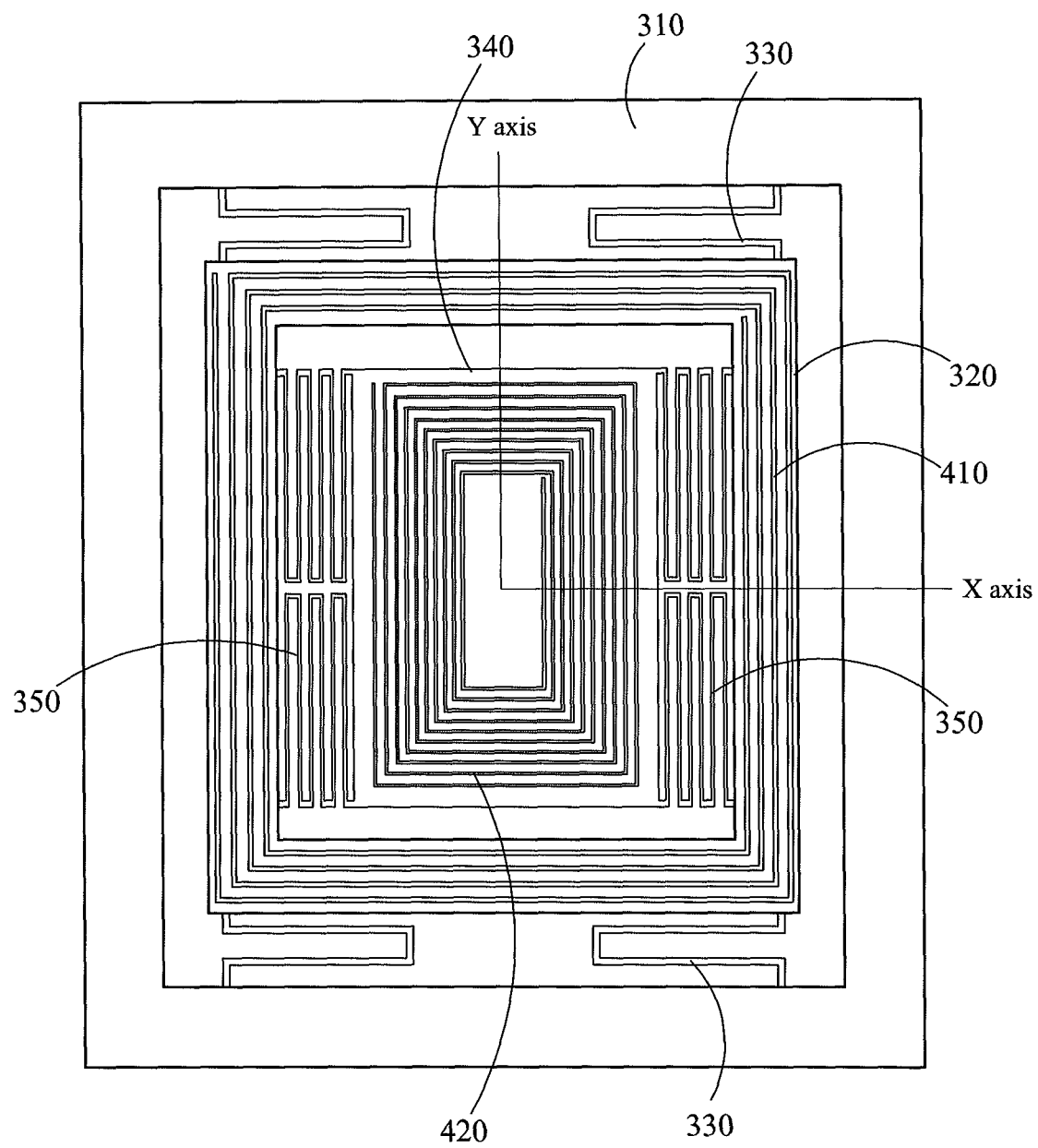
FIG. 7 is a schematic elevated view of a fourth embodiment of micro-electromechanical system carrier according to the present invention.

Referring to FIG. 7, another micro-electromechanical system (MEMS) carrier according to the present embodiment is capable of moving in X- and Y-axis directions, including a first frame 310, a second frame 320, two first return springs 330, a movable carrier element 340, two second return springs 350, a first conductive coil 410, and a second conductive coil 420.

In this embodiment, the second frame 320 is formed within the first frame 310, and a first conductive coil 410 is formed on the second frame 320. The two first return springs 330 are connected between the first frame 310 and the second frame 320 being aligned with each other in the Y-axis direction. The movable carrier element 340 is formed inside the second frame 320, and the second conductive coil 420 is embedded in or formed on the surface of the movable carrier element 340. The two second return springs 350 are connected between the movable carrier element 340 and the second frame 320 in X-axis direction, so as to provide a restoring force to the movable carrier element 340 in X-axis direction. In this embodiment, the X-axis direction is perpendicular to the Y-axis direction, and the movable carrier element 340 can move on a two dimensional plane by controlling the current I flow in the first conductive coil 410 and the second conductive coil 420.

As being described in the aforementioned embodiments, the first conductive coil 410 may be embedded in or formed on either surface of the second frame 320. Similarly, the second conductive coil 420 may also be embedded in or formed on the surface of the movable carrier element 340. In other embodiment, the first conductive coil 410 is embedded in or formed on both surfaces of the second frame 320, and the second conductive coil 420 is embedded in or formed on both surfaces of the movable carrier element 340. In another embodiment, the second conductive coil 420 is formed around the movable carrier element 340.

Figure 8:
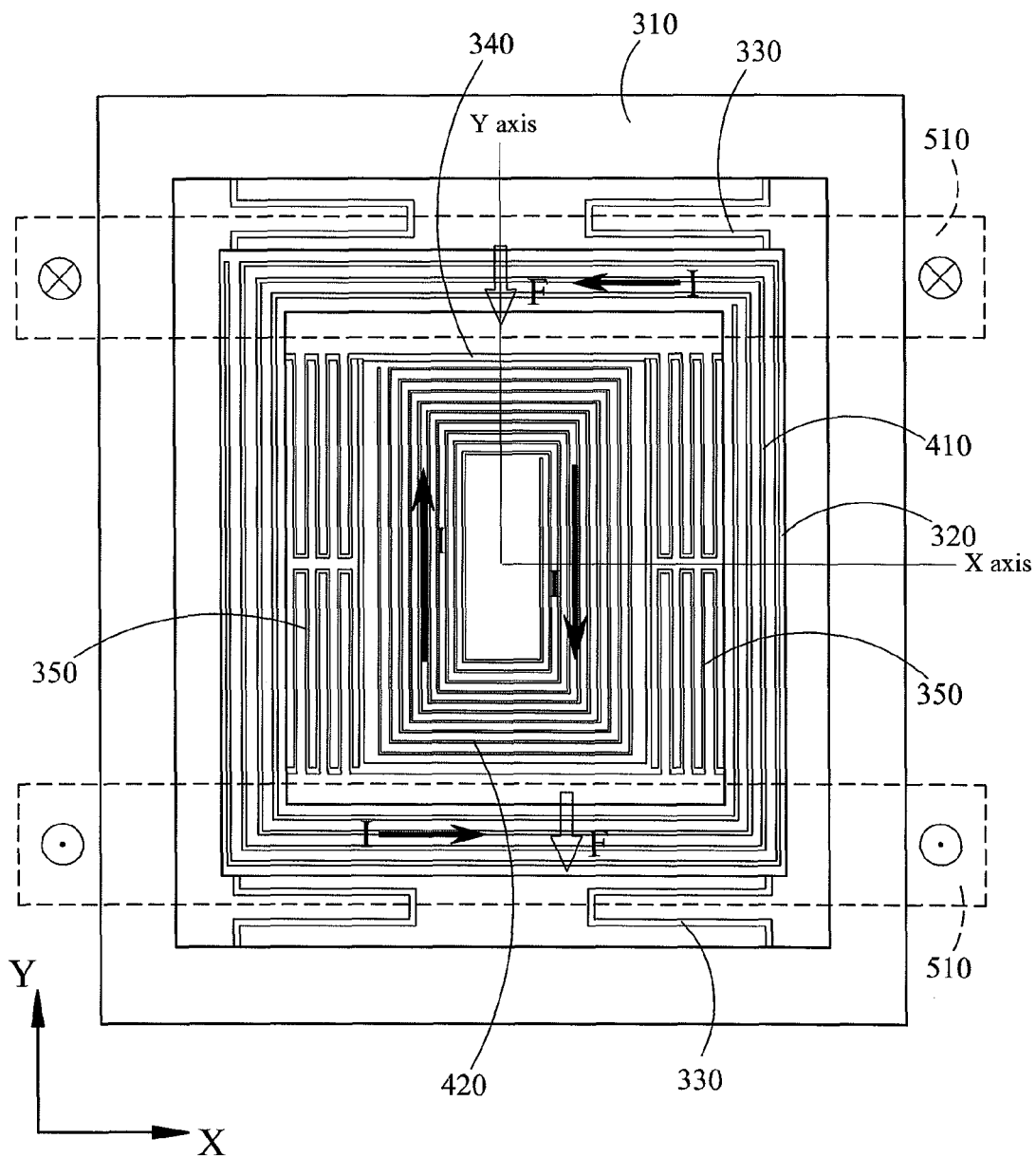
FIG. 8 is a schematic elevated view illustrating the operation of the micro-electromechanical system carrier of FIG. 7.

As shown in FIG. 8, two magnetic fields being created in opposite directions by two pair of permanent magnets 510. By this arrangement, when the current I flows in the second conductive coil 420 in clockwise direction, the conductive coil shall co-act with the magnetic field to generate an electromagnetic Lorentz force F to move the movable carrier element 340 in X-axis direction; and while the current I being stopped, two second return springs 350 shall provide sufficient support and move the movable carrier element 340 back to its original position.

Due to the direction of the magnetic field being opposite to the magnetic field co-acting with the second conductive coil 420 (both magnetic field directions being indicated as ⊙ and ⊕ as shown in FIG. 8), while the current I has flowed in the first conductive coil 410 in clockwise direction, the first conductive coil 410 shall co-act with said magnetic field to generate an electromagnetic Lorentz force F to move the second frame 320 in Y-axis direction. As the movable carrier element 340 being flexibly connected to the second frame 320, said electromagnetic Lorentz force F would carry the second frame 320 as well as the movable carrier element 340 to move in Y-axis direction; and while the current I being stopped, the two first return springs 330 shall provide sufficient support and push the second frame 320 to move back to the original position thereof in Y-axis direction.

By controlling the intensity and direction of the current I in first conductive coil 410 and second conductive coil 420, the movable carrier element 340 may be precisely positioned in an X-Y plane. By this way, the micro-electromechanical system carrier according to the present invention can be incorporated into a two-axis autofocus miniature camera module.

Figure 9:
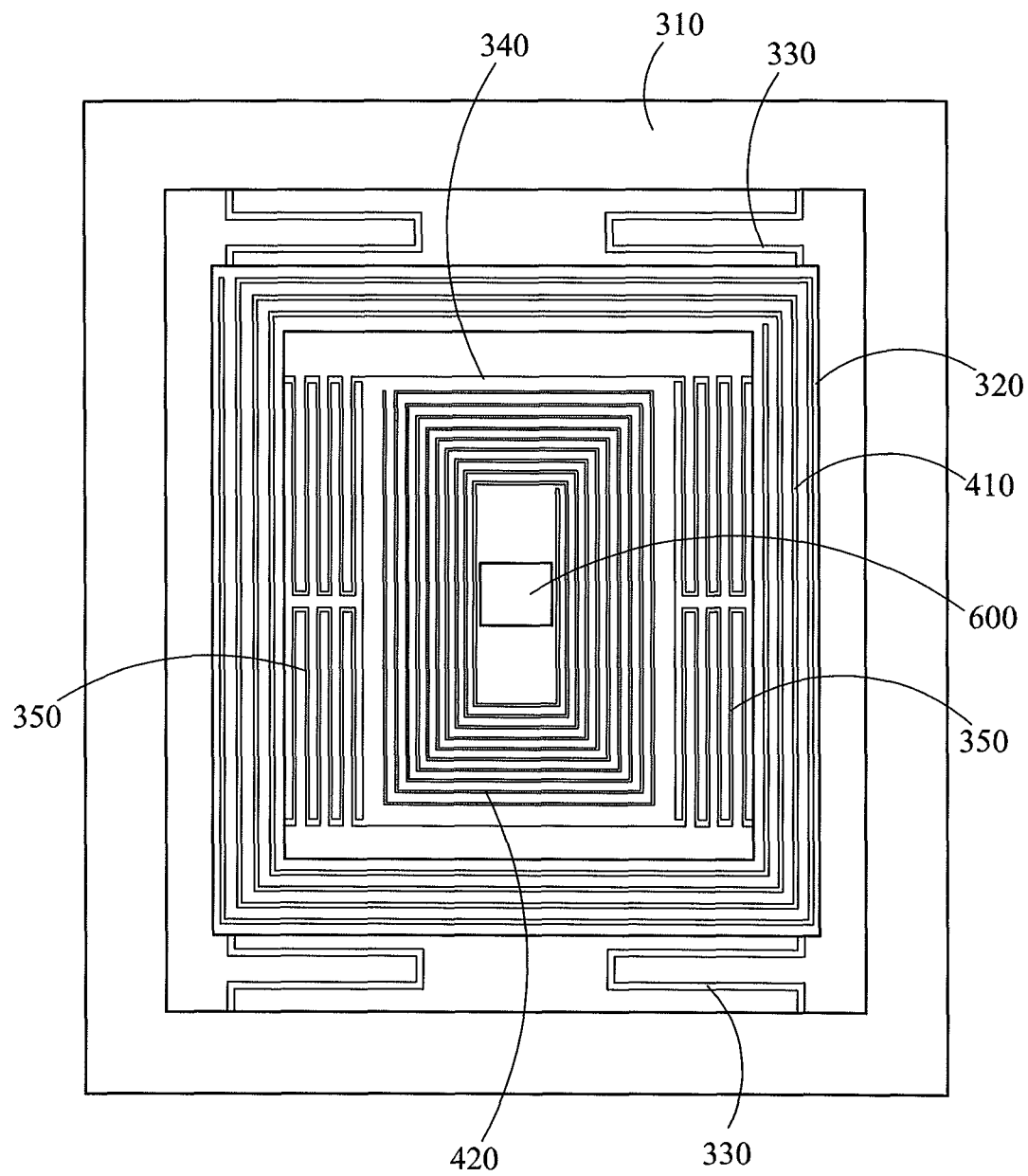
FIG. 9 is a schematic elevated view illustrating the micro-electromechanical system carrier incorporated in a miniature camera module.

Referring to FIG. 9, the movable carrier element 340 can be adopted to carry an image sensor 600, such as a CMOS image sensor, moving in an X-Y plane so as to achieve an optical image stabilization function. By incorporating the micro-electromechanical system carrier of the present invention in an autofocus miniature camera module, the designer can improve the product with further minimize, noiseless, anti-vibration, and low power consumption.

The advantages of the present invention include a capability of driving the movable carrier element 340 by controlling the intensity and direction of the current I flow in the first conductive coil 410 and second conductive coil 420, by this way to generate one or more electromagnetic Lorentz forces F in one or more directions.

Existing micro-electromechanical system technology being achieved an extremely high precision manufacturing less than one micron, it is far beyond traditional machining process can provide. Micro-electromechanical system element has the advantage of microminiaturization, lightweight, high-precision and getting fast dynamic response. Compare to the like carrier structure such as Voice Coil Motor (VCM), the micro-electromechanical system carrier of the present invention can achieve more better microminiaturization, good system integration, high optical axis precision and more suitable for mass production for miniature camera module manufacturing process.

While particular embodiments of the invention have been described, those skilled in the art will recognize that many modifications are possible that will achieve the same goals by substantially the same system, device or method, and where those systems, devices or methods still fall within the true spirit and scope of the invention disclosed.

The invention claimed is:

1. A micro-electromechanical system (MEMS) carrier, including:
   a frame;
   a movable carrier element, having first and second surfaces and formed within the frame and movable along a path;
   a conductive coil, formed on the movable carrier element;
   two return springs, formed between the movable carrier element and the frame thereby connecting the movable carrier element to the frame and providing a return force to the carrier element; and
   a pair of permanent magnets, forming a magnetic field for co-acting with the conductive coil for generating an electromagnetic Lorentz force to drive the movable carrier element to move against the return force of the two return springs.

2. The micro-electromechanical system (MEMS) carrier according to claim 1, wherein the conductive coil is formed on one of the surfaces of the movable carrier element.

3. The micro-electromechanical system (MEMS) carrier according to claim 1, wherein the conductive coil is embedded in one of the surfaces of the movable carrier element.

4. The micro-electromechanical system (MEMS) carrier according to claim 1, wherein the conductive coil is formed on both surfaces of the movable carrier element.

5. The micro-electromechanical system (MEMS) carrier according to claim 1, wherein the conductive coil is embedded in both surfaces of the movable carrier element.

6. The micro-electromechanical system (MEMS) carrier according to claim 1, wherein the conductive coil is formed around the movable carrier element.

7. A micro-electromechanical system (MEMS) carrier, including:
   a first frame;
   a second frame, having first and second surfaces and formed within the first frame and movable in a Y-axis direction;
   a first conductive coil, formed on the second frame;
   two first return springs, formed between the first frame and the second frame thereby connecting the second frame to the first frame and providing a return force to the second frame in the Y-axis direction;

a movable carrier element, having first and second surfaces and forming inside the second frame and movable in an X-axis direction;

a second conductive coil, formed on the movable carrier element;

two second return springs, formed between the movable carrier element and the second frame thereby connecting the second frame to the movable carrier element and providing a return force to the movable carrier element in the X-axis direction; and two pair of permanent magnets, forming two magnetic fields in opposite direction for co-acting with the first conductive coil and the second conductive coil, respectively, for generating an electromagnetic Lorentz force to drive the second frame to move in the Y-axis direction against the return force of the two first return springs, and generating another electromagnetic Lorentz force to drive the movable carrier element to move in the X-axis direction against the return force of the two second return springs.

8. The micro-electromechanical system (MEMS) carrier according to claim 7, wherein the X-axis axis direction is perpendicular to the Y-axis direction.

9. The micro-electromechanical system (MEMS) carrier according to claim 7, wherein the first conductive coil is formed on one of the surfaces of the second frame.

10. The micro-electromechanical system (MEMS) carrier according to claim 7, wherein the first conductive coil is embedded in one of the surfaces of the second frame.

11. The micro-electromechanical system (MEMS) carrier according to claim 7, wherein the second conductive coil is embedded in one of the surfaces of the movable carrier element.

12. The micro-electromechanical system (MEMS) carrier according to claim 7, wherein the first conductive coil is embedded in both surfaces of the second frame.

13. The micro-electromechanical system (MEMS) carrier according to claim 7, wherein the second conductive coil is embedded in both surfaces of the movable carrier element.

* * * * *